United States Patent [19]
Iyer

[11] Patent Number: 6,046,098
[45] Date of Patent: Apr. 4, 2000

[54] PROCESS OF FORMING METAL SILICIDE INTERCONNECTS

[75] Inventor: Ravi Iyer, Boise, Id.

[73] Assignee: Micron Technology, Inc., Boise, Id.

[21] Appl. No.: 09/027,603

[22] Filed: Feb. 23, 1998

[51] Int. Cl.[7] .................. H01L 21/337; H01L 21/4763
[52] U.S. Cl. ................. 438/622; 438/626; 438/629; 438/186; 438/195
[58] Field of Search ..................... 438/622, 626, 438/627, 629, 633, 638, 643, 660, 186, 189, 195, 592, 596

[56] References Cited

U.S. PATENT DOCUMENTS

| | | |
|---|---|---|
| 4,557,943 | 12/1985 | Rosier et al. . |
| 4,708,904 | 11/1987 | Shimizu et al. . |
| 5,023,201 | 6/1991 | Stanasolovich et al. . |
| 5,173,450 | 12/1992 | Wei . |
| 5,223,456 | 6/1993 | Malwah ............................ 437/200 |
| 5,344,729 | 9/1994 | Akins et al. . |
| 5,543,361 | 8/1996 | Lee et al. . |
| 5,670,397 | 9/1997 | Chang et al. ....................... 437/34 |
| 5,763,923 | 6/1998 | Hu et al. ........................... 257/382 |
| 5,773,360 | 6/1998 | Chang et al. ...................... 438/626 |
| 5,804,499 | 9/1998 | Dehm et al. ....................... 438/592 |
| 5,814,557 | 9/1998 | Venkatraman et al. ............. 438/622 |
| 5,858,872 | 1/1999 | Kim ................................. 438/626 |
| 5,904,516 | 5/1999 | Park ................................. 438/197 |
| 5,981,367 | 11/1999 | Gonzlaez ........................... 438/593 |

OTHER PUBLICATIONS

Kittl, Hong, Rodder, Prinslow and Misium, "A Ti Salicide Process for 0.10 μm Gate Length CMOS Technology", from 1996 Symposium Technology Digest of Technical Papers, pp. 14 and 15, month unknown.

Ando, Matsubara, Ishigami, Horiuchi and Nishimoto, "Novel Salicide Technology Using Ti Hydrogenation for 0.1–μm CMOS", from 1996 Symposium on VLSI Technology Digest of Tech. Papers, pp. 16–17, month unknown.

S. Wolf, *Silicon Processing for the VLSI Era, Volume 2—Process Integration*, 1990, pp. 144–150, month Unknown.

*Primary Examiner*—David Nelms
*Assistant Examiner*—Michael S. Lebentritt
*Attorney, Agent, or Firm*—Killworth, Gottman, Hagan & Schaeff LLP

[57] ABSTRACT

A process for forming a metal suicide interconnect includes applying a layer of polysilicon over a semiconductor layer. A layer of amorphous silicon is formed over the layer of polysilicon followed by a layer of metal, such as titanium, over the layer of amorphous silicon. The layer of titanium is reacted with the layer of amorphous silicon to form a small grain C49 layer of titanium silicide. The layer of polysilicon and the layer of titanium silicide are etched to form a desired interconnect structure. The small grain C49 layer of titanium silicide is then converted to the C54 phase.

29 Claims, 5 Drawing Sheets

PROCESS OF FORMING METAL SILICIDE INTERCONNECTS

BACKGROUND OF THE INVENTION

The present invention relates in general to the formation of metal silicide interconnects, and, more particularly, to a process of forming a metal silicide interconnects using a layer of amorphous silicon.

In the manufacture of integrated circuits used in the construction of dynamic random access memories (DRAMs), static random access memories (SRAMs), and the like, interconnects are required to provide the necessary electrical paths between field effect transistors and other devices fabricated on the semiconductor substrate and the external circuitry used to pass data to and from these devices. Heavily-doped polysilicon is commonly used to form the gate as well as the drain/source contacts of a metal oxide semiconductor field effect transistor (MOSFET) because of its compatibility with the underlying silicon semiconductor structure. Titanium silicide ($TiSi_2$) is commonly used in conjunction with the polysilicon to form the necessary interconnects as it is compatible with the polysilicon and, more importantly, reduces the sheet resistance of the polysilicon. Polycide contacts and interconnects comprising polysilicon and titanium silicide are increasingly being used with MOSFETs having self-aligned gates.

$TiSi_2$ typically exists in two phases, C49 and C54. The C49 phase of $TiSi_2$ occurs when a layer of $TiSi_2$ is first formed. The C49 phase is then annealed at a sufficient temperature to convert the higher resistivity phase C49 $TiSi_2$ (smaller grain size) to the lower resistivity phase C54 $TiSi_2$ (larger grain size). As $TiSi_2$ is used to lower the resistance of polysilicon, it is desirable to convert C49 $TiSi_2$ to C54 $TiSi_2$. It is well known that the $TiSi_2$ salicide process is only scalable to a gate length which is larger than the C49 grain size. For gate lengths which are less than the C49 grain size, the thermal budget required to transform the C49 phase to the desired C54 phase increases dramatically, leading to agglomeration and formation of Kirkendall voids.

While agglomeration of $TiSi_2$ can be suppressed by high temperature sputtering of Ti, the sheet resistance (Rs) of the $TiSi_2$ still degrades due to Kirkendall void formation in gate lines with a width of 0.1 $\mu$m or less. The voids can be effectively suppressed by thinning the deposited Ti film as thin Ti film is easier to bend. However, thinner Ti film further degrades Rs because the silicide formation is surpassed by the nitride formation during the $N_2$ anneal. It is therefore desirable to enhance the silicidation process by limiting the consumption of silicon from the polysilicon during the formation of $TiSi_2$, while also reducing the nitridation of Ti.

Typically, $TiSi_2$ is formed by physical vapor deposition (PVD) or chemical vapor deposition (CVD). PVD entails sputtering titanium onto the semiconductor structure, and particularly, onto the polysilicon. $TiSi_2$ is then formed by annealing the structure at the appropriate temperature and for an appropriate period of time. However, the anneal consumes part of silicon in the polysilicon in forming the $TiSi_2$, thereby degrading the silicidation process and increasing the formation of voids. In CVD, titanium tetrachloride ($TiCl_4$) is combined with silane ($SiH_4$) in the gas phase at an appropriate temperature to form $TiSi_2$ and HCl. However, silicon from the underlying layer of polysilicon is also partially consumed in this reaction.

A number of techniques have been devised to reduce the consumption of the underlying polysilicon in forming $TiSi_2$. One such method includes pre-amorphization of the underlying polysilicon by ion implantation. However, such a method is expensive and requires complex steps in controlling the thickness and doping level of the polysilicon. Another method is disclosed in U.S. Pat. No. 5,173,450 to Wei in which a layer of polysilicon is formed over a semiconductor structure, followed by a layer of titanium and a layer of amorphous silicon. The layer of amorphous silicon is formed over the layer of titanium in order to provide a source of silicon for the formation of the $TiSi_2$. However, the reaction also consumes silicon from the polysilicon with the requisite degradation of the silicidation process and increased void formation.

Accordingly, there is a need for a method of forming a metal silicide interconnect in which the silicidation process is enhanced by limiting the consumption of silicon from the polysilicon during the formation of the metal silicide and by also reducing the nitridation of the metal. Preferably, such a method could be used in forming a sub 0.1 $\mu$m gate structure, would be inexpensive, easy to implement, and would not entail excess processing steps.

SUMMARY OF THE INVENTION

The present invention meets this need by providing a method for forming a metal silicide interconnect in which a layer of metal is reacted with a layer of amorphous silicon. The amorphous silicon provides the source of silicon for the silicidation process thereby enhancing the process. The layer of amorphous silicon also reduces the nitridation of the metal.

According to a first aspect of the present invention, a process of forming an interconnect structure comprises providing at least one semiconductor layer. A layer of polysilicon is formed over the at least one semiconductor layer. A layer of amorphous silicon is formed over the layer of polysilicon. A layer of metal is then formed over the layer of amorphous silicon and reacted with the layer of amorphous silicon to form a metal silicide structure. The layer of amorphous silicon may have a thickness in the range of about 100 Angstroms to about 3,000 Angstroms, and typically, approximately 1,000 Angstroms. The layer of metal may have a thickness in the range of about 30 Angstroms to about 2,000 Angstroms, and typically, approximately 500 Angstroms. Preferably, the metal may comprise titanium.

The process may further comprise the step of patterning the layers of polysilicon, amorphous silicon and metal to form the interconnect structure. The step of patterning the layers of polysilicon, amorphous silicon and metal to form the interconnect structure may be performed after the step of reacting the layer of amorphous silicon with the layer of metal to form a metal silicide structure. The step of forming a layer of amorphous silicon over the layer of polysilicon comprises the step of doping the layer of amorphous silicon with impurities, such as phosphorous. The layer of amorphous silicon may comprise amorphous silicon hydride.

According to another aspect of the present invention, a process of forming an interconnect structure comprises providing at least one semiconductor layer. A layer of polysilicon is formed over the at least one semiconductor layer. A layer of amorphous silicon is formed over the layer of polysilicon using plasma enhanced chemical vapor deposition (PECVD) followed by a layer of titanium. The layer of amorphous silicon is then reacted with the layer of metal to form a metal silicide structure. The step of forming a layer of amorphous silicon over the layer of polysilicon using PECVD comprises the step of forming Si and H free radicals by the decomposition of $SiH_4$. The step of forming Si and H free radicals through the decomposition of $SiH_4$ comprises forming silicon hydride having a formula of $SiH_x$, where x has a value from about 0.1 to about 5. PECVD is performed in a PECVD reactor, and the value of x is set by controlling at least one of the RF power, the temperature and the pressure of the PECVD reactor.

The step of forming a layer of amorphous silicon over the layer of polysilicon using PECVD may comprise the step of dissolving $H_2$ in the layer of amorphous silicon. The step of dissolving $H_2$ in the layer of amorphous silicon is carried out through the decomposition of $SiH_4$. An amount of dissolved $H_2$ may be adjusted by controlling at least one of the RF power, the temperature and the pressure of a PECVD reactor. The step of reacting the layer of amorphous silicon with the layer of metal to form a metal silicide structure may also comprise the step of forming H radicals through the decomposition of the dissolved $H_2$.

According to yet another aspect of the present invention, a process of forming an interconnect structure comprises providing at least one semiconductor layer. A layer of polysilicon is formed over the at least one semiconductor layer. A layer of amorphous silicon is formed over the layer of polysilicon followed by a layer of titanium over the layer of amorphous silicon. The layer of amorphous silicon is reacted with the layer of titanium to form a C49 titanium silicide structure. The C49 titanium silicide structure is then converted to a C54 titanium silicide structure. The C54 titanium silicide structure preferably has a sheet resistance less than 12 ohm/sq. The step of converting the C49 titanium silicide structure to a C54 titanium silicide structure comprises the step of annealing said C49 titanium suicide structure at a temperature ranging from about 700° C. to about 950° C.

According to a further aspect of the present invention, a process of forming an interconnect structure comprises providing at least one semiconductor layer. A layer of polysilicon is formed over the at least one semiconductor layer. A layer of amorphous silicon having a thickness in the range of about 100 Angstroms to about 3,000 Angstroms is formed over the layer of polysilicon using plasma enhanced chemical vapor deposition (PECVD). A layer of titanium is formed over the layer of amorphous silicon and is reacted with the layer of amorphous silicon to form a titanium silicide structure. The step of reacting the layer of amorphous silicon with the layer of titanium to form a titanium silicide structure comprises the step of annealing the layer of amorphous silicon and the layer of titanium. The step of annealing the layer of amorphous silicon and the layer of titanium is carried out at a temperature ranging from about 500° C. to about 750° C.

According to yet another aspect of the present invention, a process of forming an interconnect structure comprises providing at least one semiconductor layer. A layer of polysilicon is formed over the at least one semiconductor layer. A first layer of amorphous silicon is formed over the layer of polysilicon. A layer of metal is formed over the first layer of amorphous silicon. A second layer of amorphous silicon is formed over the layer of metal. The first and second layers of amorphous silicon are reacted with the layer of metal to form a metal silicide structure. The first layer of amorphous silicon may have a thickness in the range of about 50 Angstroms to about 1,500 Angstroms, and typically, approximately 500 Angstroms. The second layer of amorphous silicon may have a thickness in the range of about 50 Angstroms to about 1,500 Angstroms, and typically, approximately 500 Angstroms. The first and second layers of amorphous silicon may comprise amorphous silicon hydride.

According to a still further aspect of the present invention, a process of forming an interconnect structure comprises providing at least one semiconductor layer. A layer of polysilicon having a thickness in the range of about 500 Angstroms to about 1500 Angstroms is formed over the at least one semiconductor layer. A layer of amorphous silicon having a thickness in the range of about 100 Angstroms to about 3,000 Angstroms and comprising free radicals having a formula of $SiH_x$, where x has a value from about 0.1 to about 5 is formed over the layer of polysilicon using plasma enhanced chemical vapor deposition (PECVD) of $SiH_4$. A layer of titanium having a thickness in the range of about 30 Angstroms to about 2,000 Angstroms is formed over the layer of amorphous silicon using physical vapor deposition (PVD). The layer of amorphous silicon is reacted with the layer of titanium at a temperature ranging from about 500° C. to about 750° C. to form a C49 titanium silicide structure. The C49 titanium silicide structure is annealed at a temperature ranging from about 700° C. to about 950° C. to convert it to a C54 titanium silicide structure.

According to another aspect of the present invention, a process of forming a field effect transistor having a self-aligned gate comprises providing a substrate assembly having at least one semiconductor layer. Source and drain regions of the field effect transistor are formed in the at least one semiconductor layer. A gate oxide for the self-aligned gate is formed over the at least one semiconductor layer. A layer of polysilicon is formed over the at least one semiconductor layer covering the gate oxide. A layer of amorphous silicon is formed over the layer of polysilicon followed by a layer of titanium. The layer of amorphous silicon is reacted with the layer of metal to form a titanium silicide structure. A gate length of the gate is preferably less than 0.1 $\mu$m. The process may further comprise the step of patterning the layers of polysilicon, amorphous silicon and titanium to form the interconnect structure.

According to a still further aspect of the present invention, a process of forming a memory array comprising a plurality of memory cells arranged in rows and columns with each of the plurality of memory cells comprising at least one field effect transistor comprises providing at least one semiconductor layer. A source, a drain and a gate oxide for each of the field effect transistors are formed over the at least one semiconductor layer. A layer of polysilicon is formed over the at least one semiconductor layer. A layer of amorphous silicon is formed over the layer of polysilicon followed by a layer of titanium. The layer of amorphous silicon is reacted with the layer of titanium to form a titanium silicide structure. The titanium silicide structure is patterned for interconnecting desired gates of each of the field effect transistors and other structures formed as part of the memory array.

According to a further aspect of the present invention, a process of fabricating a wafer comprises providing a wafer having a substrate assembly having at least one semiconductor layer thereon. A repeating series of sources, drains and gate oxides for at least one field effect transistor on each of a plurality of individual die on the wafer is formed over the at least one semiconductor layer. A layer of polysilicon is formed over the at least one semiconductor layer. A layer of amorphous silicon is formed over the layer of polysilicon followed by a layer of titanium. The layer of amorphous silicon is reacted with the layer of titanium to form a titanium silicide structure. The titanium silicide structure is then patterned for interconnecting desired structures on each of the plurality of individual die on the wafer.

Accordingly, it is an object of the present invention to provide a process of forming a metal silicide interconnect in which the silicidation process is enhanced by limiting the consumption of silicon from the polysilicon during the formation of the metal silicide and by also reducing the nitridation of the metal. It is a further object of the present invention to provide a process of forming a titanium silicide interconnect with a sub 0.1 µm gate structure which is inexpensive, easy to implement, and does not entail excess processing steps.

Other features and advantages of the invention will be apparent from the following description, the accompanying drawings and the appended claims.

DETAILED DESCRIPTION OF THE PREFERRED EMBODIMENTS

Figure 1:
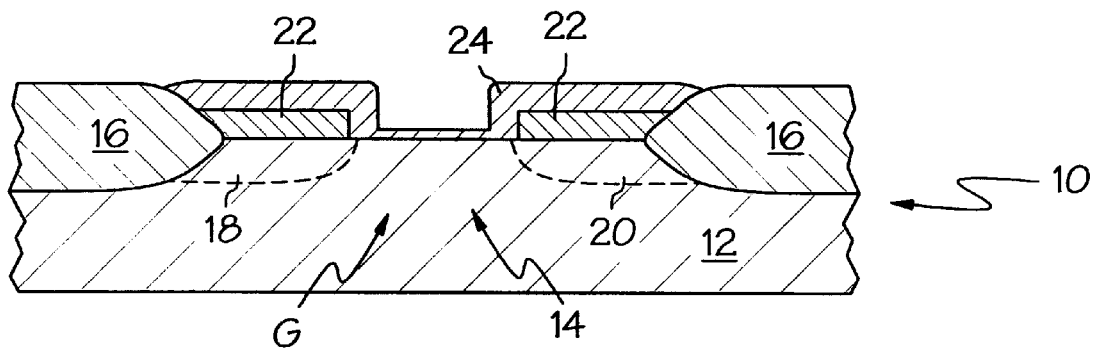
FIGS. 1–4 are enlarged, sectioned side views depicting the formation of a titanium interconnect structure for a MOSFET according to an aspect of the present invention.

Referring now to FIG. 1, a substrate assembly 10 is shown. The substrate assembly 10 comprises a semiconductor layer 12, which is silicon in the illustrated embodiment, and may also include additional layers or structures which define active or operable portions of semiconductor devices (not shown). For example, the semiconductor layer 12 of the substrate assembly 10 may be formed on insulating material, sapphire or another base material. The semiconductor layer 12 is doped with impurities to form a semiconductor of a first/p-type conductivity, or a second/n-type conductivity.

A number of different semiconductor devices may be formed on the semiconductor layer 12. In the illustrated embodiment, a metal oxide semiconductor field effect transistor (MOSFET) 14 having a self-aligned gate is formed. It will be appreciated by those skilled in the art that the term MOSFET is a generic term for any field effect transistor in which a conductive material is formed over the gate insulating material of a field effect transistor. For example, the conductive material may be metallic, conductive polysilicon or a similar conductive material. Polysilicon is typically used as the conductive material with MOSFETs having self-aligned gates to form the contact of the gate. Similarly, titanium silicide is a material commonly used to form an interconnect with polysilicon. While the method of the present invention is described in conjunction with polysilicon as part of the gate structure of a MOSFET having a self-aligned gate, the method is suitable for any interconnect structure comprising polysilicon or silicon as part of the contact.

The MOSFET 14 having a self-aligned gate (G) may be formed in accordance with the process described in copending application, U.S. Ser. No. 08/858,772, A METHOD OF FORMING A FIELD EFFECT TRANSISTOR HAVING A SELF-ALIGNED GATE, filed May 19, 1997, by Donahue et al., herein incorporated by reference. The MOSFET 14 is isolated by a pair of field oxide regions 16 between which a source 18 and a drain 20 are formed. It will be appreciated by those skilled in the art that the drain and source terminals of a MOS transistor are typically identical with the drain/source label being applied for descriptive purposes once a voltage is applied to the transistor. A conductive layer 22 contacts the source 18 and the drain 20 and defines the gate (G) of the MOSFET 14. A gate oxide layer 24 is formed over semiconductor layer 12 and in conjunction with the conductive layer 22 defines the critical dimension for the self-aligned gate (G).

Figure 2:
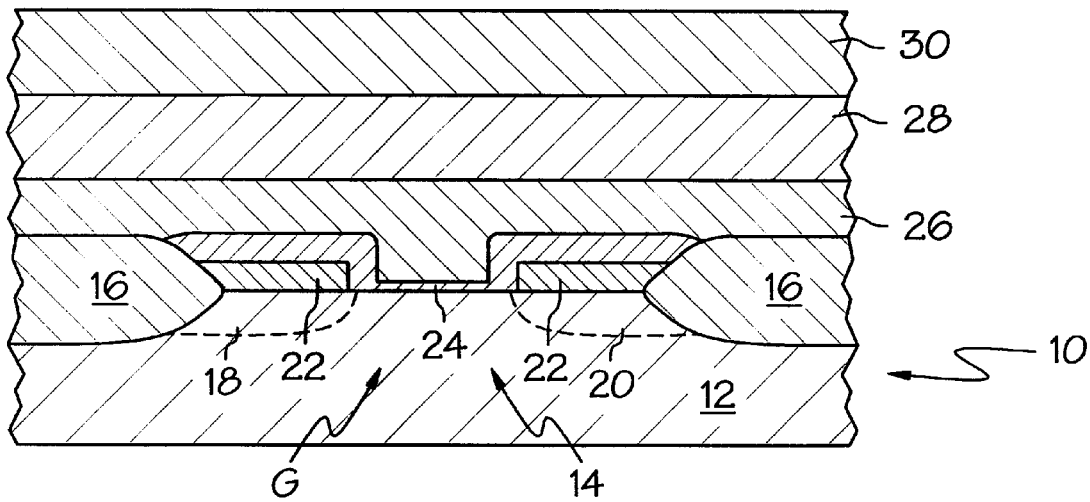

Referring now to FIG. 2, a layer of polysilicon 26 is formed over the semiconductor layer 12 by any conventional deposition technique, such as chemical vapor deposition (CVD) at a temperature ranging from about 600° C. to about 700° C., and typically from about 625° C. to about 650° C., for a predetermined period of time, to a thickness ranging from about 500 Angstroms to about 1500 Angstroms, and preferably about 1000 Angstroms. Silane gas ($SiH_4$) or dichlorosilane ($SiCl_2H_2$) are commonly used in the deposition process. The layer of polysilicon 26 must be doped to increase its conductivity and to also provide a good ohmic contact. Typically, phosphorous in the form of $PH_3$ is used as a dopant due to its high solubility in silicon. The layer of polysilicon 26 may be doped during the polysilicon deposition or after the layer 26 is formed by diffusion or ion implantation.

A layer of amorphous silicon 28 is then formed over the layer of polysilicon 26 to a thickness ranging from about 100 Angstroms to about 3,000 Angstroms, and preferably about 1,000 Angstroms. The layer of amorphous silicon 28 is formed using any conventional deposition technique, such as through plasma enhanced chemical vapor deposition (PECVD). PECVD is similar to CVD except it is performed at relatively low temperature and low pressure with the combination of the two features providing good film uniformity and throughput. PECVD is conducted in a PECVD reactor with a plasma being established by a radiofrequency-induced glow discharge. Typical conditions for forming amorphous silicon by PECVD include pressure ranging from about 2 torr to about 10 torr, temperature ranging from about 300° C. to about 600° C., RF power ranging from about 50 W to about 1000 W, $SiH_4$ flow in the range of about 10 sccm to amount 200 sccm, and an inert gas flow, such as argon, ranging from about 50 sccm to about 2000 sccm. The layer of amorphous silicon 28 is also in situ doped with impurities, such as phosphorous, by providing a flow of $PH_3$ ranging from about 5 sccm to 100 sccm in the deposition chamber.

The process of forming the layer of amorphous silicon 28 results in the formation of silicon hydride and the formation of dissolved $H_2$ in that layer. Amorphous silicon hydride can be represented by $SiH_x$ (where x has a value ranging from about 0.1 to about 5). The amount of dissolved $H_2$ and the amount of hydrogen in $SiH_x$, and thus the value of x, is controlled by adjusting at least one of the RF power, the temperature and the pressure in of PECVD reactor, i.e., the greater the RF power the lower the amount of hydrogen. While $SiH_x$ is formed during the formation of the layer 28, high temperatures associated with subsequent processing steps cause the formation of the H free radicals as hydrogen bonds are broken. The H free radicals reduce the nitridation formation during the silicidation process and suppress the anomalous increase in the sheet resistance (Rs) of the interconnect.

A layer of a refractory metal such as, for example, titanium 30 is then formed over the layer of amorphous silicon 28 to a thickness ranging from about 30 Angstroms to about 2,000 Angstroms, and preferably about 500 Angstroms. In the illustrated embodiment, the layer of titanium 30 is formed by sputtering titanium using physical vapor deposition (PVD) at a temperature ranging from about 300° C. to about 500° C. for a predetermined period of time.

Figure 3:
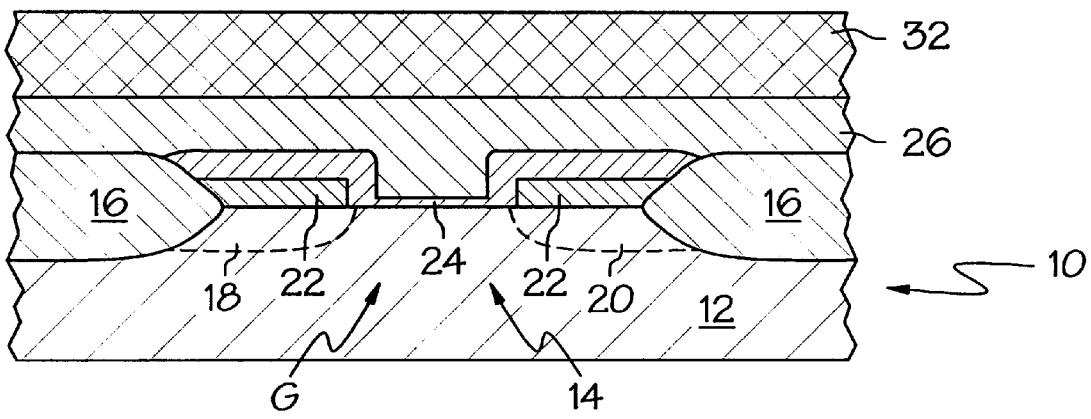

The layer of titanium 30 is reacted with the layer of amorphous silicon 28 by performing a high temperature anneal in the range of about 500° C. to about 750° C., and preferably about 675° C. for a predetermined period of time and in an atmosphere of $N_2$ to thereby form a C49 $TiSi_2$ structure 32 as shown in FIG. 3. The anneal may comprise a rapid thermal anneal (RTA) or a rapid thermal process (RTP). The anneal is performed in an oxygen free environment to prevent the formation of any undesired oxide layer. It will be appreciated by those skilled in the art that the anneal may comprise one or more such anneals of varying temperatures, times and environments. The anneal causes the formation of the H free radicals from the dissolved $H_2$ in the amorphous silicon which in conjunction with the $SiH_x$ react with the Ti to form $TiH_x$. The formation of $TiH_x$ reduces the nitridation of Ti thereby suppressing the anomalous increase in resistance as small grain size C49 $TiSi_2$ is formed. The layer of amorphous silicon 28 provides the source of silicon for the $TiSi_2$ structure 32 thereby enhancing the silicidation process as little or no silicon from the layer of polysilicon 26 is consumed. Accordingly, a low resistive $TiSi_2$ interconnect structure may be formed with MOSFETs having a gate length less than 0.1 µm.

Figure 4:
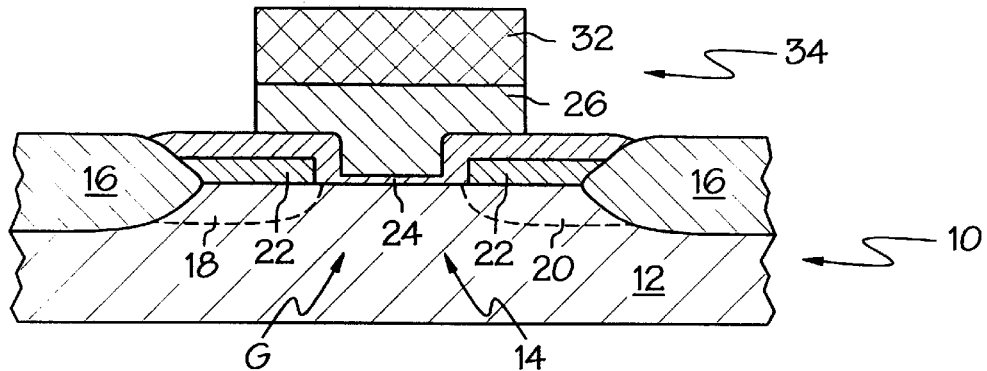

Referring now to FIG. 4, the layer of polysilicon 26 and the C49 $TiSi_2$ structure 32 are patterned using standard photolithographic masking and etching to form a patterned interconnect structure 34. Unreacted Ti as well as $TiH_x$ and TiN may be removed as a separate step or in conjunction with the above etch. The C49 $TiSi_2$ is then converted to C54 $TiSi_2$ by performing a high temperature anneal in the range of 700° C. to about 950° C., and preferably about 725° C., for a predetermined period of time. The Rs of the C54 $TiSi_2$ is less than 12 ohm/sq, and preferably less than 5 ohm/sq. It will be appreciated by those skilled in the art that the predetermined periods time for performing the various processing steps described above is dependent in part on the desired temperature of the particular processing step. It will be further appreciated by those skilled in the art that the interconnect structure 34 may be patterned after the C49 $TiSi_2$ structure is converted to C54 or before the layer of titanium 30 is reacted with the layer of amorphous silicon 28. It will be further appreciated by those skilled in the art that the layer of polysilicon 26 may be patterned prior to the formation of the layer of amorphous silicon 28, and similarly, the layers of polysilicon and amorphous silicon 26, 28 may be patterned prior to the formation of the layer of titanium 30.

While in the illustrated embodiment, titanium is the metal selected to form the metal silicide interconnect, it will be appreciated by those skilled in the art that other metals, such as tungsten, platinum, molybdenum, tantalum, vanadium, nickel, chromium, niobium, palladium, and cobalt, may be used to form the metal silicide interconnect. It will be appreciated by those skilled in the art that other processing steps may be performed, such as precleaning between steps and additional anneals, while additional layers may be added, such as metalization layers, insulation layers and protective encapsulation layers.

Figure 5:
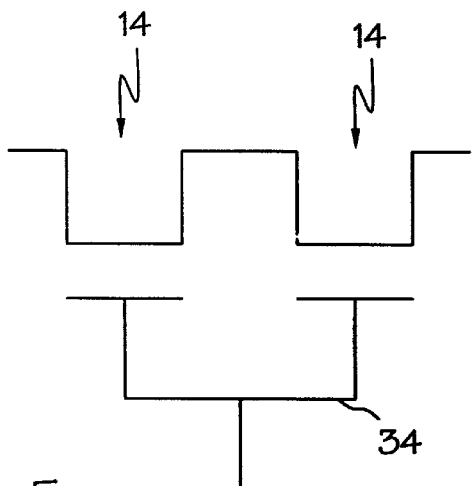
FIG. 5 is a schematic diagram of a pair of MOSFETS having their respective gates interconnected with the interconnect structure of FIG. 4.
Figure 6:
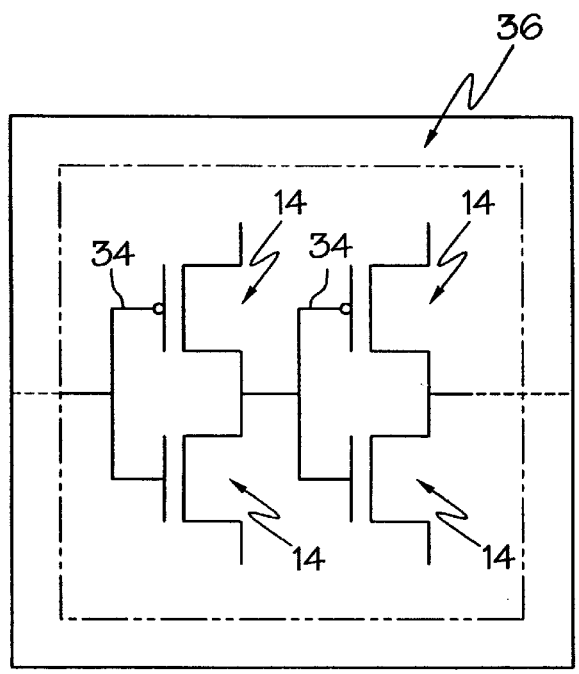
FIG. 6 is a schematic diagram of an integrated circuit with a pair of CMOS invertors interconnected with the interconnect structure of FIG. 4.
Figure 7:
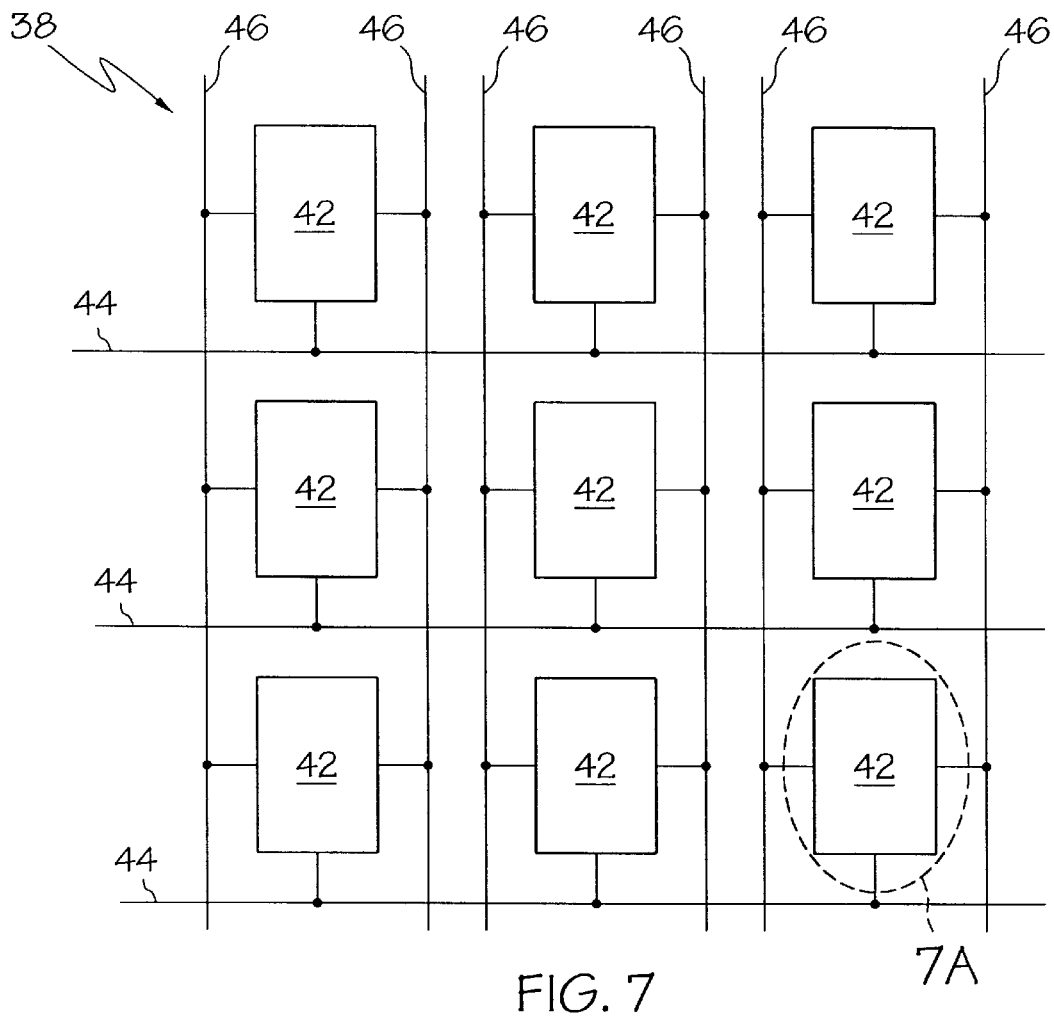
FIG. 7 is a schematic diagram of an SRAM array having a plurality of memory cells arranged in rows and columns.
Figure 7A:
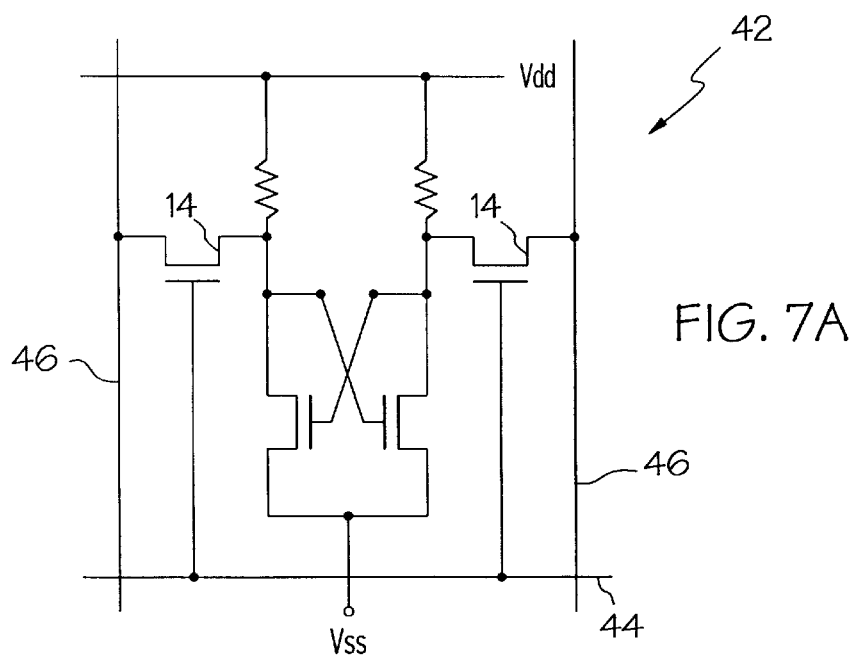
FIG. 7A is a schematic diagram of a representative memory cell of the SRAM array of FIG. 7 with the interconnect structure of FIG. 4.
Figure 8:
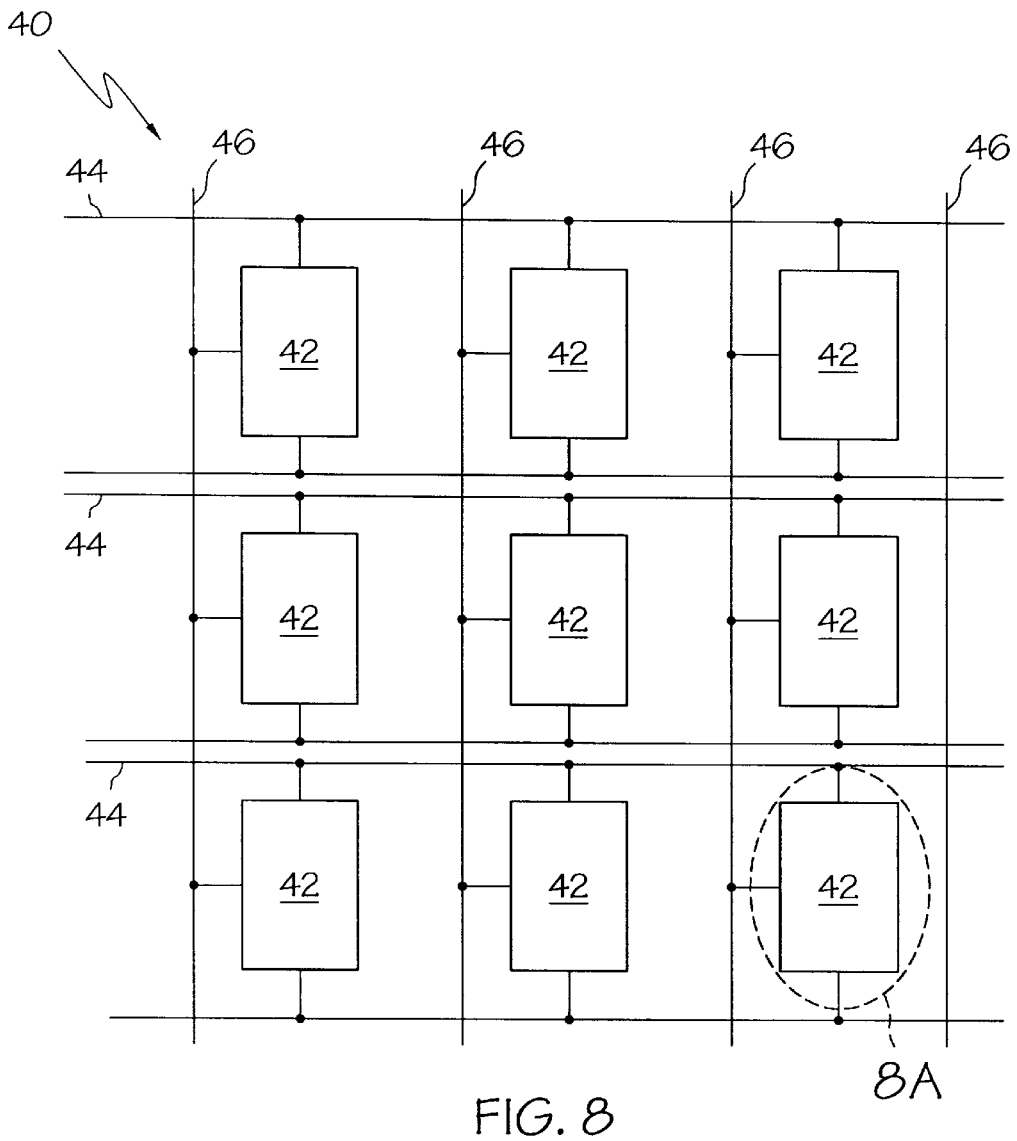
FIG. 8 is a schematic diagram of a DRAM array having a plurality of memory cells arranged in rows and columns.
Figure 8A:
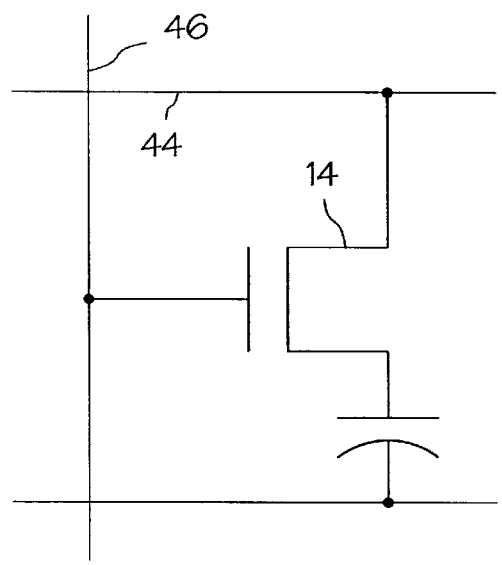
FIG. 8A is a schematic diagram of a representative memory cell of the DRAM array of FIG. 8 with the interconnect structure of FIG. 4.
Figure 9:
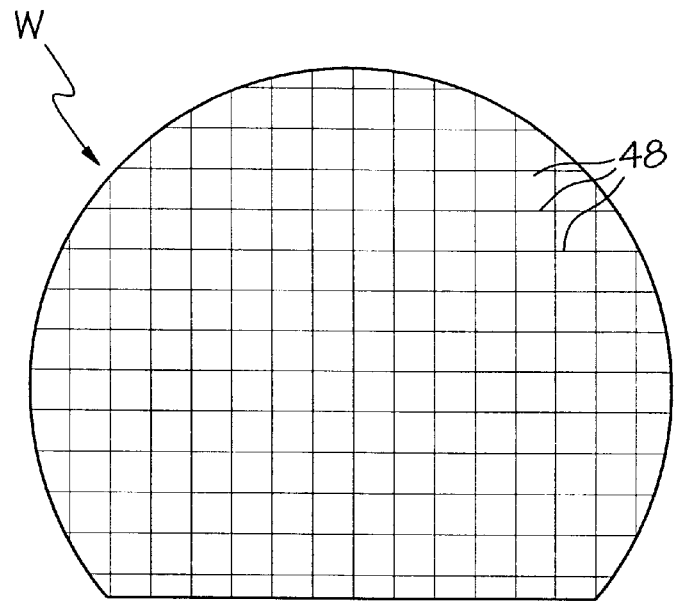
FIG. 9 is a top view of a wafer having the interconnect structure of FIG. 4.

The interconnect structure 34 may take the form of a gate structure for the transistor 14, a local interconnect for connecting the gates of two or more transistors 14, shown schematically in FIG. 5, or as an interconnect for connecting the gates of a plurality of transistors 14 in an integrated circuit 36, shown schematically in FIG. 6. The interconnect structure 34 may also be used in a typical static random access memory (SRAM) array 38 or in a typical dynamic random access memory (DRAM) array 40, as shown in FIGS. 7 and 8. The SRAM array 38 and the DRAM array 40 comprise a plurality of memory cells 42 arranged in rows and columns. Each of the memory cells 42 also comprise at least one transistor 14. As shown in FIG. 7A, each of the memory cells 42 of the SRAM array 38 comprise a pair of access transistors 14, the gates of which are coupled to a respective row line 44 via the interconnect structure 34 of FIG. 4. Similarly, as shown in FIG. 8A, each of the memory cells 42 of the DRAM array 40 comprise a switch transistor 14, the gate of which is coupled to a respective word line 46 via the interconnect structure 34 of FIG. 4. It should be apparent that the configuration of the interconnect structure 34 is dependent, in part, on the desired interconnection of the gates of the transistors 14 as well as the interconnection of the sources and drains of the transistors 14. It should also be apparent that other devices within the integrated circuit 36, the SRAM array 38 and the DRAM array 40, such as external contacts, other FET transistors, bipolar transistors, resistors, capacitors, and the like, may be interconnected via the interconnect structure 34. It should therefore be apparent that the interconnect structure 34 is not limited to connections including the gates of MOSFETs but may include connections to the other components listed above without connecting to the gate of a MOSFET. The interconnect structure 34 may also be used in the fabrication of a wafer W as shown in FIG. 9. The wafer W includes a plurality of individual dies 48. Wafer masks (not shown) are used to apply a desired circuit structure on each of the individual dies 48. The desired circuit structure may comprise any of the above described structures, i.e. the integrated circuit 36, the SRAM array 38 or the DRAM array 40, with the appropriate interconnect structure 34. The wafer W is processed using standard wafer fabrication techniques.

Figure 10:
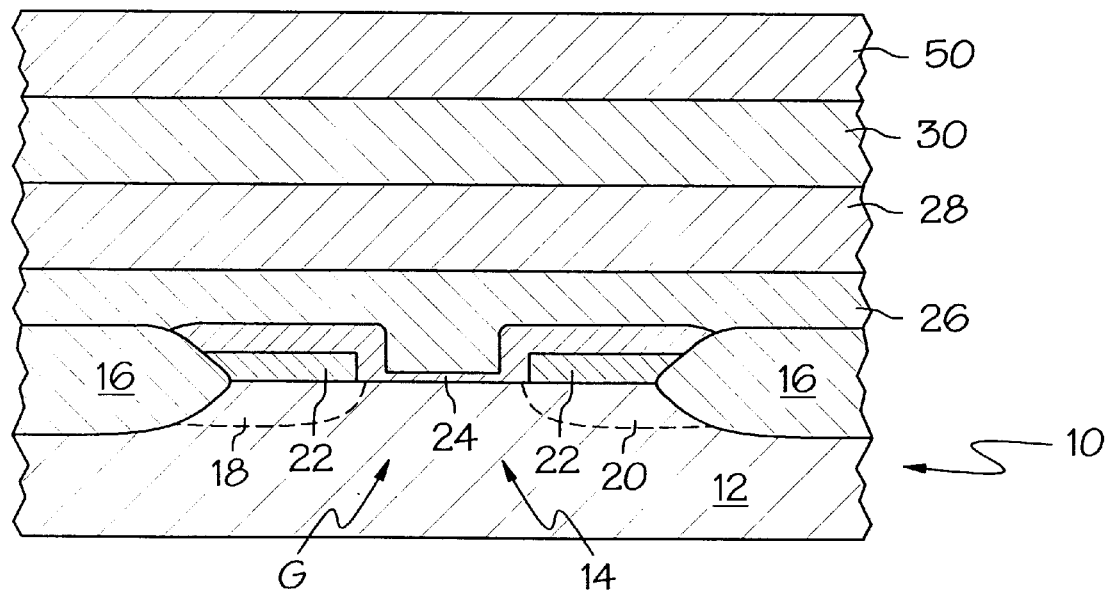
FIG. 10 is an enlarged, sectioned side view depicting the formation of a titanium interconnect structure for a MOSFET according to another aspect of the present invention.

Referring now to FIG. 10 with like reference numerals corresponding to like components, another aspect of the present invention will be described with respect to the C49 $TiSi_2$ structure 32 being formed by reacting two different layers of amorphous silicon with the layer of titanium 30. For descriptive purposes, the layer of amorphous silicon 28 will be referred to as a first layer of amorphous polysilicon 28. The first layer of amorphous silicon 28 is formed over the layer of polysilicon 26 to a thickness ranging from about 50 Angstroms to about 1,500 Angstroms, and preferably about 500 Angstroms, in the same manner as described above. The layer of titanium 30 is formed over the first layer of amorphous silicon 28 in this same manner as described above. A second layer of amorphous silicon 50 is formed over the layer of titanium 30 to a thickness ranging from about 50 Angstroms to about 1,500 Angstroms, and preferably about 500 Angstroms, in the same manner as described above with respect to the first layer of amorphous silicon 28.

The first and second layers of polysilicon 28 and 50 are reacted with the layer of titanium 30 to form the C49 TiSi$_2$ as shown in FIG. 3. Preferably, each of the first and second layers of amorphous silicon 28 and 50 provide approximately half of the silicon used to form the C49 TiSi$_2$ structure 32. It will be appreciated by those skilled in the art the thicknesses of the first and second layers of amorphous silicon 28 and 50 may be varied to provide different ratios of silicon used in forming the C49 TiSi$_2$ structure 32. The interconnect structure 34 is then formed in the same manner described above.

The silicidation process of the present invention is enhanced as the amorphous silicon provides the source of silicon in the formation of the metal silicide thereby limiting the consumption of silicon from the polysilicon. The silicidation process is also enhanced as dissolved hydrogen from the amorphous silicon reduces the nitridation of the metal thereby suppressing the anomalous increase in resistance. As the silicidation process is enhanced, a metal silicide interconnect may be formed with a sub 0.1 μm gate structure. The process is inexpensive, easy to implement, and does not entail excess processing steps.

Having described the invention in detail and by reference to preferred embodiments thereof, it will be apparent that modifications and variations are possible without departing from the scope of the invention defined in the appended claims.

What is claimed is:

1. A process of forming an interconnect structure comprising:
   providing at least one semiconductor layer;
   forming a layer of polysilicon over said at least one semiconductor layer;
   forming a layer of amorphous silicon over said layer of polysilicon;
   forming a layer of metal over said layer of amorphous silicon; and
   reacting said layer of amorphous silicon with said layer of metal to form a metal silicide structure.

2. The process of claim 1, wherein said layer of amorphous silicon has a thickness in the range of about 100 Angstroms to about 3,000 Angstroms.

3. The process of claim 2, wherein said layer of amorphous silicon has a thickness of approximately 1,000 Angstroms.

4. The process of claim 1, wherein said layer of metal comprises titanium.

5. The process of claim 1, wherein said layer of metal has a thickness in the range of about 30 Angstroms to about 2,000 Angstroms.

6. The process of claim 5, wherein said layer of metal has a thickness of approximately 500 Angstroms.

7. The process of claim 1, further comprising the step of patterning said layers of polysilicon, amorphous silicon and metal to form said interconnect structure.

8. The process of claim 7, wherein said step of patterning said layers of polysilicon, amorphous silicon and metal to form said interconnect structure is performed after said step of reacting said layer of amorphous silicon with said layer of metal to form a metal silicide structure.

9. The process of claim 1, wherein said step of forming a layer of amorphous silicon over said layer of polysilicon comprises the step of doping said layer of amorphous silicon with impurities.

10. The process of claim 9, wherein said impurities comprise phosphorous.

11. The process of claim 1, wherein said layer of amorphous silicon comprises amorphous silicon hydride.

12. A process of forming an interconnect structure comprising:
   providing at least one semiconductor layer;
   forming a layer of polysilicon over said at least one semiconductor layer;
   forming a layer of amorphous silicon over said layer of polysilicon using plasma enhanced chemical vapor deposition (PECVD);
   forming a layer of metal over said layer of amorphous silicon; and
   reacting said layer of amorphous silicon with said layer of metal to form a metal silicide structure.

13. The process of claim 12, wherein said step of forming a layer of amorphous silicon over said layer of polysilicon using PECVD comprises the step of forming Si and H free radicals by the decomposition of SiH$_4$.

14. The process of claim 13, wherein said step of forming Si and H free radicals through the decomposition of SiH$_4$ comprises forming silicon hydride having a formula of SiH$_x$, where x has a value from about 0.1 to about 5.

15. The process of claim 14, wherein PECVD is performed in a PECVD reactor, and said value of x is set by controlling at least one of the RF power, the temperature and pressure of said PECVD reactor.

16. The process of claim 14, wherein said step of forming a layer of amorphous silicon over said layer of polysilicon using PECVD comprises the step of dissolving H$_2$ in said layer of amorphous silicon.

17. The process of claim 16, wherein said step of dissolving H$_2$ in said layer of amorphous silicon is carried out through the decomposition of SiH$_4$.

18. The process of claim 17, wherein an amount of dissolved H$_2$ is adjusted by controlling at least one of the RF power, temperature and pressure of a PECVD reactor.

19. The process of claim 16, wherein said step of reacting said layer of amorphous silicon with said layer of metal to form a metal silicide structure comprises the step of forming H radicals through the decomposition of said dissolved H$_2$.

20. A process of forming an interconnect structure comprising:
   providing at least one semiconductor layer;
   forming a layer of polysilicon over said at least one semiconductor layer;
   forming a layer of amorphous silicon over said layer of polysilicon;
   forming a layer of titanium over said layer of amorphous silicon;
   reacting said layer of amorphous silicon with said layer of titanium to form a C49 titanium silicide structure; and
   converting said C49 titanium silicide structure to a C54 titanium silicide structure.

21. The process of claim 20, wherein said C54 titanium silicide structure has a sheet resistance less than 12 ohm/sq.

22. The process of claim 20, wherein said step of converting said C49 titanium silicide structure to a C54 titanium silicide structure comprises the step of annealing said C49 titanium silicide structure at a temperature ranging from about 700° C. to about 950° C. to convert it to said C54 titanium silicide structure.

23. A process of forming an interconnect structure comprising:

providing at least one semiconductor layer;

forming a layer of polysilicon over said at least one semiconductor layer;

forming a layer of amorphous silicon over said layer of polysilicon using plasma enhanced chemical vapor deposition (PECVD), said layer of amorphous silicon having a thickness in the range of about 100 Angstroms to about 3,000 Angstroms;

forming a layer of titanium over said layer of amorphous silicon; and reacting said layer of amorphous silicon with said layer of titanium to form a titanium silicide structure.

24. The process of claim 23, wherein said step of reacting said layer of amorphous silicon with said layer of titanium to form a titanium silicide structure comprises the step of annealing said layer of amorphous silicon and said layer of titanium.

25. The process of claim 24, wherein said step of annealing said layer of amorphous silicon and said layer of titanium is carried out at a temperature ranging from about 500° C. to about 750° C.

26. A process of forming an interconnect structure comprising:

providing at least one semiconductor layer;

forming a layer of polysilicon over said at least one semiconductor layer, said layer of polysilicon having a thickness in the range of about 500 Angstroms to about 1500 Angstroms;

forming a layer of amorphous silicon over said layer of polysilicon using plasma enhanced chemical vapor deposition (PECVD) of $SiH_4$, said layer of amorphous silicon having a thickness in the range of about 100 Angstroms to about 3,000 Angstroms and comprising free radicals having a formula of $SiH_x$, where x has a value from about 0.1 to about 5;

forming a layer of titanium over said layer of amorphous silicon using physical vapor deposition (PVD), said layer of titanium having a thickness in the range of about 30 Angstroms to about 2,000 Angstroms;

reacting said layer of amorphous silicon with said layer of titanium at a temperature ranging from about 500° C. to about 750° C. to form a C49 titanium silicide structure; and annealing said C49 titanium silicide structure at a temperature ranging from about 700° C. to about 950° C. to convert it to a C54 titanium silicide structure.

27. A process of forming a field effect transistor having a self-aligned gate, said process comprising:

providing a substrate assembly having at least one semiconductor layer;

forming source and drain regions of said field effect transistor in said at least one semiconductor layer;

forming a gate oxide for said self-aligned gate over said at least one semiconductor layer;

forming a layer of polysilicon over said at least one semiconductor layer and covering said gate oxide;

forming a layer of amorphous silicon over said layer of polysilicon;

forming a layer of titanium over said layer of amorphous silicon; and reacting said layer of amorphous silicon with said layer of metal to form a titanium silicide structure.

28. The process of claim 27, wherein a gate length of said gate is less than 0.1 $\mu$m.

29. The process of claim 27, further comprising the step of patterning said layers of polysilicon, amorphous silicon and titanium to form said, titanium silicide structure.

* * * * *